(12) United States Patent
Hamada et al.

(10) Patent No.: US 6,284,041 B1
(45) Date of Patent: Sep. 4, 2001

(54) PROCESS FOR GROWING A SILICON SINGLE CRYSTAL

(75) Inventors: Ken Hamada, Saga; Hiroyuki Tanabe, Amagasaki, both of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/376,466

(22) Filed: Aug. 18, 1999

(30) Foreign Application Priority Data

Aug. 18, 1998 (JP) .................................................. 10-231418

(51) Int. Cl.$^7$ ...................................................... C30B 15/04
(52) U.S. Cl. ................................................. 117/19; 117/13
(58) Field of Search ........................................ 117/13, 19

(56) References Cited

U.S. PATENT DOCUMENTS

| | | | |
|---|---|---|---|
| 4,478,675 | * | 10/1984 | Akai . |
| 4,609,530 | * | 9/1986 | Morioka et al. . |
| 5,423,283 | * | 6/1995 | Seki ........................................ 117/19 |
| 6,019,838 | * | 2/2000 | Canella ................................. 117/19 |

FOREIGN PATENT DOCUMENTS

0435440A1 * 11/1990 (EP) .
4-325488    11/1992 (JP) .

* cited by examiner

Primary Examiner—Felisa Hiteshew
(74) Attorney, Agent, or Firm—Armstrong, Westerman, Hattori, McLeland & Naughton, LLP

(57) ABSTRACT

A process for growing a single crystal in which variation in a dopant concentration in a melt contained in a crucible can be reduced and a single crystal having small variation in specific resistance can be produced. The process is the Czhohralski growth of a silicon single crystal including the steps: melting a crystal raw material in a crucible; bringing into contact a seed crystal to a melt contained in the crucible to thereby stabilize the surface temperature of the melt that is called "the seed crystal contact technique;" and adding a dopant into the crucible after carrying out the seed crystal contact technique. Furthermore, in the process, a dopant may be added while the seed crystal contact technique is stopped, and the seed crystal contact technique may be carried out again. Alternatively, a dopant may be added while the seed crystal contact technique is carried out.

14 Claims, 2 Drawing Sheets

Dopant addition process of the present invention

Conventional dopant addition process

Dopant addition process of the present invention

PROCESS FOR GROWING A SILICON SINGLE CRYSTAL

BACKGROUND OF THE INVENTION

1. Field of the Invention

The present invention relates to a process for growing a silicon single crystal based on the Czochralski method, including addition of a dopant, more particularly, to a process for growing a silicon single crystal in which the concentration of a dopant in a melt can be regulated within a predetermined range even when a dopant having a high evaporation speed is added, and a single crystal having small variation in specific resistance can be produced.

2. Description of the Prior Art

There are a variety of processes for producing a single crystal and among other things, the Czochralski method is widely employed for pulling a silicon single crystal in view of potentiality of industrial mass production. In the Czochralski method, a silicon single crystal is grown in a closed, atmosphere-controlled metal chamber in which a crucible containing a melt of polycrystalline silicon serving as a crystal source is placed. The tail end of a seed crystal, which is set on the top of pulling apparatus including a wire, is contacted to the surface of the melt. When the seed crystal is pulled upward, the melt is solidified onto the tail end thereof, to thereby grow a single crystal.

In the growth of a silicon single crystal, the shape of the pulled single crystal comprises a necking portion which is connected to a seed crystal and has a constricted diameter of a cylinder; a cone portion having a cylindrical diameter gradually increasing; and a main body serving as a wafer product after crystal growth. Specifically, a process for growing a single crystal comprises the steps of: forming a necking portion to render a produced single crystal dislocation-free; forming a shoulder portion serving as a cone portion to ensure a sufficient diameter of the produced single crystal; and forming a main body by pulling a single crystal with maintaining the above diameter.

Conventionally, in order to grow a single crystal having a target specific resistance, a predetermined amount of dopant such as phosphorus (P), boron (B), arsenic (As), or antimony (Sb) has been incorporated into a melt from an early stage of pulling. In general, a dopant having a relatively low vaporization speed such as P or B is added to a crystal raw material and the mixture is molten as a preliminary step for single crystal growth. However, when a dopant having a relatively high vaporization speed such as As or Sb is added to a crystal raw material from a melting step, a large amount of added dopant is vaporized during the melting step, to thereby affect a doping efficiency. Thus, such a dopant is added to a melt contained in a crucible after a crystal raw material is molten.

FIG. 1 (PRIOR ART) is a flow chart showing a dopant addition step during a conventional process for growing a silicon single crystal. As described above, a dopant is added to a melt contained in a crucible after a crystal raw material is completely molten. After the dopant is added, a seed crystal is brought into contact to a melt. This step is referred to as "the seed crystal contact technique." In general the seed crystal contact technique is carried out a predetermined time after melting of a crystal raw material, since the temperature of the melt just after melting of the raw material is higher than the melting temperature of silicon and variation in temperature is locally significant to thereby induce large variation in temperature of the entirety of the melt. The seed crystal contact technique is a method for stabilizing the surface temperature of a melt comprising the steps: bringing into contact a seed crystal with a melt so as to form a meniscus; assuming the surface temperature through observation of the meniscus; and controlling the output electric power of a heater to thereby regulate heat input to the melt.

When the seed crystal contact technique is completed and the melt contained in the crucible is sufficiently stabilized, growth of a single crystal is initiated. Thereafter, as described above, a necking portion and a cone portion having a cylindrical diameter gradually increasing are successively formed and a main body having a diameter corresponding to that of a wafer product is formed through pulling.

As described above, the seed crystal contact technique is carried out in order to regulate the temperature of a melt. However, there are a variety of external factors of variation in temperature during actual operations, and the time which is required to complete stabilization of the melt to thereby allow a single crystal to grow is not constant. Therefore, the time from addition of a dopant to start of single crystal growth, i.e., the formation of a necking portion significantly varies. Under such circumstances, especially when a dopant having a high speed of vaporization from a melt such as As or Sb is added, the concentration of the added dopant in the melt contained in a crucible significantly varies due to variation of the time from addition of the dopant to the formation of a necking portion. Therefore, some single crystals, which do not ensure a target specific resistance, are disadvantageously produced among the silicon single crystals grown from a dopant-added melt.

In accordance with recent trends of semiconductor devices having a high-quality function, specific resistance of a device substrate is strictly regulated. Thus, an important problem that variation in the time from addition of the dopant to initiation of single crystal growth induces variation of a dopant concentration in the melt becomes critical and must be solved as quickly as possible. In connection with this problem, it has been proposed that the time from addition of the dopant to initiation of single crystal growth be constantly fixed to a longer time in consideration of variation in the above time. However, this method is not advantageous in view of production efficiency. Actually, the time from the addition of the dopant to the initiation of single crystal growth varies from 1.0 to 12.0 based on a minimum unit time.

In order to suppress variation in the time from the addition of the dopant to initiation of single crystal growth, the timing for adding dopant has been determined based on the data obtained through optical measurement of the temperature of a melt. However, this measurement has a limitation in accuracy and a poor reliability when the temperature of the melt is optically detected by use of an optical thermometer such as a mono- or bi-color thermometer. Therefore, even when the dopant is added based on the data obtained through the above optical measurement, the effect of such addition on suppression of variation is insufficient.

SUMMARY OF THE INVENTION

The present invention is provided to solve the above-described problems, and an object of the present invention is to provide a process for producing a single crystal having low variation in specific resistance in which the dopant concentration of a melt can be adjusted within a predetermined range through suppression of variation in the time from addition of a dopant to initiation of single crystal growth.

The present inventors have conducted earnest studies in order to solve the above-described problems based on the assumption that the abovedescribed the seed crystal contact technique is most effective for stabilizing a melt contained in a crucible. Thus, the present inventors have found that a dopant is added into a crucible after application of the seed crystal contact technique to thereby shorten the time required for stabilizing the melt and suppress variation in the time to initiation of growth.

The present invention has been accomplished based on the above-mentioned finding. Accordingly, the present invention is drawn to the following (1), (2), and (3) processes for growing a silicon single crystal.

(1) A process for growing a silicon single crystal based on the Czochralski method comprising:
  a) a step of melting a crystal raw material in a crucible;
  b) a step of bringing into contact a seed crystal to a melt contained in the crucible to thereby stabilize the surface temperature of the melt that is called "the seed crystal contact technique;" and
  c) a step of adding a dopant into the crucible after carrying out the seed crystal contact technique.

(2) As a first embodiment of (1) above, a process for growing a silicon single crystal based on the Czochralski method comprising:
  a) a step of melting a crystal raw material in a crucible;
  b) a step of bringing into contact a seed crystal with a melt contained in the crucible to thereby stabilize the surface temperature of the melt, which is hereafter called "the seed crystal contact technique;"
  c) a step of stopping seed crystal contact technique and adding a dopant into the crucible; and
  d) a step of carrying out the seed crystal contact technique again after addition of a dopant.

In (2) above, the dopant may be added in an amount of 0.1% or more based on the crystal raw material.

(3) As a second embodiment of (1) above, a process for growing a silicon single crystal based on the Czochralski method comprising:
  a) a step of melting a crystal raw material in a crucible;
  b) a step of bringing into contact a seed crystal with a melt contained in the crucible to thereby stabilize the surface temperature of the melt that is called "the seed crystal contact technique;" and
  c) a step of adding a dopant while the seed crystal contact technique is carried out.

In (3) above, the dopant may be added in an amount less than 0.1% based on the crystal raw material.

Preferably, the dopant is arsenic or antimony having a high vaporization speed.

Preferably, the grown single crystal has a uniform specific resistance distribution.

Preferably, the time from the addition of a dopant to the formation of a necking portion is shortened.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with an accompanying drawings, in which.

DESCRIPTION OF PREFERRED EMBODIMENTS

Figures 1, 2:
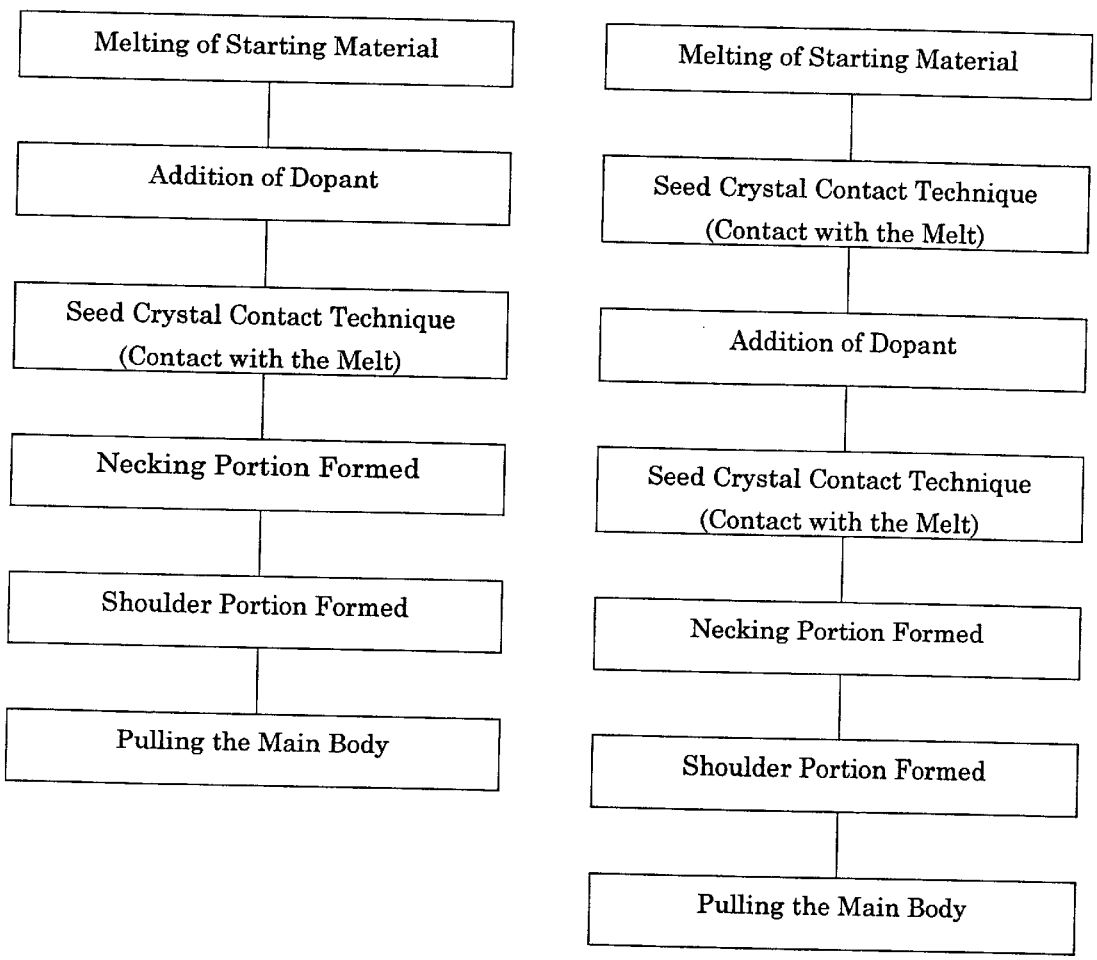
FIG. 1 (PRIOR ART) is a flow chart showing a step for adding a dopant during a conventional process for growing a silicon single crystal.
FIG. 2 is a flow chart showing a step for adding a dopant during a process for growing a silicon single crystal according to the present invention.

FIG. 2 is a flow chart showing a step for adding a dopant during a process for growing a silicon single crystal according to the present invention. As is clear from FIG. 2, the process of the present invention comprises the steps of: melting a crystal raw material in a crucible; bringing into contact a seed crystal to a melt contained in the crucible to thereby stabilize the surface temperature of the melt that is called "the seed crystal contact technique;" and adding a dopant into the crucible after carrying out the seed crystal contact technique. When the seed crystal contact technique is completed and the melt contained in the crucible is adjusted in temperature and is sufficiently stabilized, growth of a single crystal is initiated. Thereafter, a necking portion and a cone portion having a cylindrical diameter gradually increasing are successively formed and a main body having a diameter corresponding to that of a wafer product is formed through pulling.

Typically, the temperature of a stabilized melt suitable for pulling a silicon single crystal is 1420° C.–1430° C. In some cases, variation in temperature of a melt just after melting of a crystal raw material is as large as more than 100 degrees. In order to detect stabilization of a melt, the seed crystal contact technique is the most ideal method. Specifically, a seed crystal is brought into contact with the melt so as to form a meniscus, and the surface temperature can be assumed through observation of the meniscus. Then, the output electric power of a heater is controlled to thereby regulate heat input to the melt, and the surface temperature of the melt can be stabilized.

A first embodiment of the present invention includes stopping the seed crystal contact technique in which a seed crystal is brought into contact to a melt; adding a dopant; and carrying out the seed crystal contact technique again. The stopping of the seed crystal contact technique, which is a step of detaching a seed crystal contacting to a melt from the melt, is employed when a dopant is added in a relatively large amount. Therefore, in the first embodiment, the dopant is added in an amount of about 0.1% or more based on a polycrystalline material. After the dopant is added in such an amount, the seed crystal is brought into contact again, to thereby carry out the seed crystal contact technique.

In a second embodiment of the present invention, a dopant is added into a crucible while the seed crystal contact technique, in which a seed crystal is brought into contact with a melt is carried out. The embodiment is adapted when a dopant is added in a small amount. In this case, the dopant is added in an amount less than about 0.1% based on a polycrystalline material while the seed crystal is contacted to the melt.

EXAMPLES

The present invention will next be described by way of examples. The effect of the process for growing a silicon single crystal of the present invention is evaluated through comparison with comparative examples.

Example

The procedure including addition of a dopant shown in FIG. 2 was performed, to thereby grow a <111> silicon single crystal having a cylindrical diameter of 4 inches. At first, polycrystalline silicon serving as a crystal raw material was placed in a 14-inch-crucible made of quartz, and the raw material was molten. A seed crystal was brought into contact with the melt contained in the crucible, to carry out the seed crystal contact technique. Subsequently, the seed crystal contact technique was stopped and Sb serving as a dopant was added in an amount of 100 g. Thereafter, the seed crystal contact technique was carried out again, to thereby stabilize the melt. Then, growth of a silicon single crystal was initiated.

Comparative Example 1

The procedure including addition of a dopant shown in FIG. 1 (PRIOR ART) was performed, to thereby grow a <111> silicon single crystal having a cylindrical diameter of 4 inches. At first, polycrystalline silicon serving as a crystal raw material was placed in a 14-inch-crucible made of quartz, and the raw material was molten. Subsequently, Sb serving as a dopant was added in an amount of 100 g, and the seed crystal contact technique was carried out, to thereby stabilize the melt. Then, growth of a silicon single crystal was initiated.

Comparative Example 2

The procedure of Comparative Example 1 was performed, to thereby grow a <111> silicon single crystal having a cylindrical diameter of 4 inches. At first, polycrystalline silicon serving as a crystal raw material was placed in a 14-inch-crucible made of quartz, and the raw material was molten. The timing for adding a dopant was determined based on the temperature data measured by use of a monocolor thermometer. Subsequently, Sb serving as a dopant was added in an amount of 100 g, and the seed crystal contact technique was carried out, to thereby stabilize the melt. Then, growth of a silicon single crystal was initiated.

Measurement of Specific Resistance

Figure 3A:
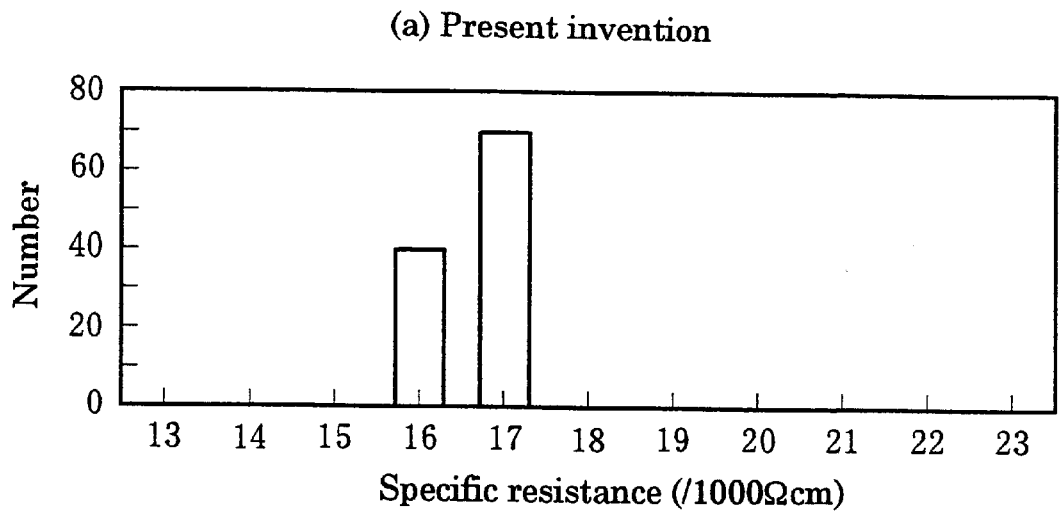
FIGS. 3A through 3C are graphs showing the specific resistance distribution of 100 samples of silicon single crystals grown in Example and Comparative Examples.
Figure 3B:
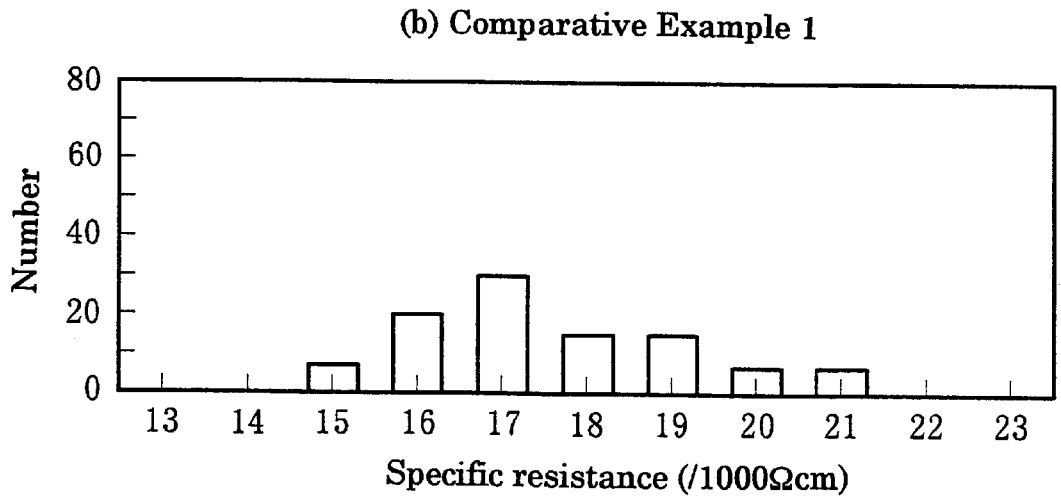
Figure 3C:
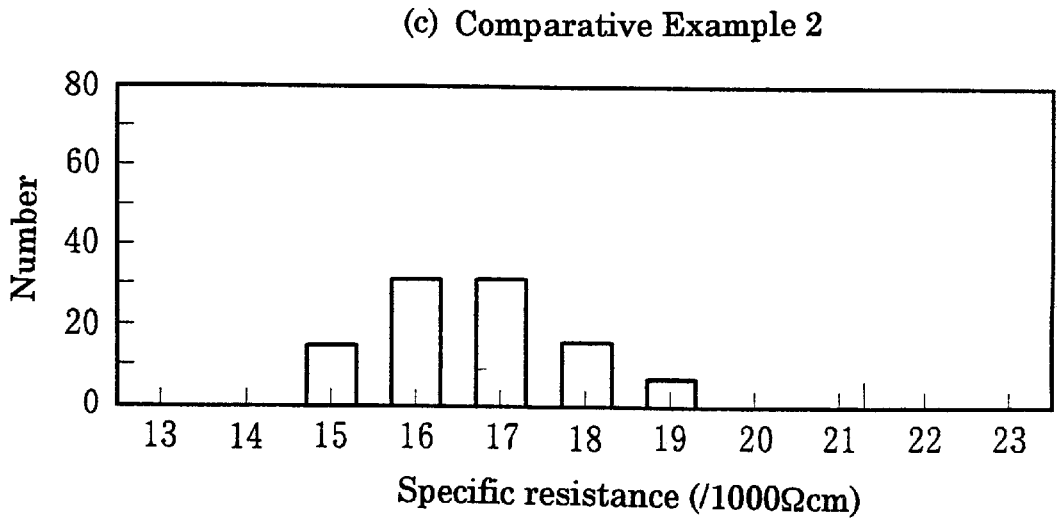

Each of FIGS. 3A through 3C is a graph showing specific resistance distribution of 100 samples of silicon single crystals grown in Example and Comparative Examples 1 and 2. Specifically, FIG. 3A shows the distribution of the measured specific resistance of single crystals grown in Example; FIG. 3B shows that of single crystals grown in Comparative Example 1; and FIG. 3C shows that of single crystals grown in Comparative Example 2.

As shown in FIGS. 3A through 3C, the single crystals grown in Example has specific resistance more stable than that of single crystals grown in Comparative Examples 1 and 2. Moreover, in the above examples, the times from the addition of a dopant to the initiation of single crystal growth, i.e., formation of a necking portion were compared. It is confirmed that the variation in the time in the process of the present invention is reduced to approximately 18% based on that in Comparative Example 1.

As described hereinabove, the process for growing a silicon single crystal according to the present invention enables to suppress variation in the time from the addition of a dopant to the initiation of single crystal growth; to regulate the concentration of a dopant in a melt within a predetermined range; and to produce a single crystal having small variation in specific resistance. The process of the present invention can catch up with recent significant trends of semiconductor devices having a high-quality function.

What is claimed is:

1. A process for growing a silicon single crystal based on the Czochralski method comprising:

a) a step of melting a crystal raw material in a crucible;

b) a step of bringing into contact a seed crystal with a melt contained in the crucible to thereby stabilize a surface temperature of the melt that is called "the seed crystal contact technique"; and c) a step of adding a dopant into the crucible after carrying out the seed crystal contact technique.

2. A process for growing a silicon single crystal according to claim 1, wherein the dopant is arsenic or antimony having a high vaporization speed.

3. A process for growing a silicon single crystal according to claim 1, wherein the grown single crystal has a uniform specific resistance distribution.

4. A process for growing a silicon single crystal according to claim 1, wherein the time from addition of a dopant to formation of a necking portion is shortened.

5. A process for growing a silicon single crystal based on the Czochralski method comprising:

a) a step of melting a crystal raw material in a crucible;

b) a step of bringing into contact a seed crystal with a melt contained in the crucible to thereby stabilize a surface temperature of the melt that is called "the seed crystal contact technique";

c) a step of stopping the seed crystal contact technique and adding a dopant into the crucible; and d) a step of carrying out the seed crystal contact technique again after addition of a dopant.

6. A process for growing a silicon single crystal according to claim 5, wherein the dopant is arsenic or antimony having a high vaporization speed.

7. A process for growing a silicon single crystal according to claim 5, wherein when the dopant is added into the crucible, the dopant may be added in an amount of 0.1% or more based on the crystal raw material.

8. A process for growing a silicon single crystal according to claim 5, wherein the grown single crystal has a uniform specific resistance distribution.

9. A process for growing a silicon single crystal according to claim 5, wherein the time from the addition of a dopant to the formation of a necking portion is shortened.

10. A process for growing a silicon single crystal based on the Czochralski method comprising:

a) a step of melting a crystal raw material in a crucible;

b) a step of bringing into contact a seed crystal with a melt contained in the crucible to thereby stabilize a surface temperature of the melt that is called "the seed crystal contact technique"; and c) a step of adding a dopant while the seed crystal contact technique is carried out.

11. A process for growing a silicon single crystal according to claim 10, wherein the dopant is arsenic or antimony having a high vaporization speed.

12. A process for growing a silicon single crystal according to claim 10, wherein when the dopant is added into the crucible, the dopant may be added in an amount less than 0.1% based on the crystal raw material.

13. A process for growing a silicon single crystal according to claim 10, wherein the grown single crystal has a uniform specific resistance distribution.

14. A process for growing a silicon single crystal according to claim 10, wherein the time from the addition of a dopant to the formation of a necking portion is shortened.

* * * * *